United States Patent [19]

Frister et al.

[11] 4,361,867

[45] Nov. 30, 1982

[54] ELECTRICAL CONNECTION SYSTEM FOR RECTIFIERS

[75] Inventors: Manfred Frister, Schwieberdingen; Stefan Renner, Leonberg; Friedhelm Meyer, Illingen; Peter Lack, Schwieberdingen, all of Fed. Rep. of Germany

[73] Assignee: Robert Bosch GmbH, Stuttgart, Fed. Rep. of Germany

[21] Appl. No.: 224,135

[22] Filed: Jan. 12, 1981

[30] Foreign Application Priority Data

Jan. 17, 1980 [DE] Fed. Rep. of Germany ....... 3001522

[51] Int. Cl.[3] .............................................. H02M 7/06

[52] U.S. Cl. ........................................ 363/145; 337/4; 361/104

[58] Field of Search ............................... 337/1, 2, 4, 5; 361/104; 363/52, 53, 144, 145; 310/68 R, 68 D

[56] References Cited

U.S. PATENT DOCUMENTS 2,961,593 11/1960 Kozacka ........................ 361/104 X
3,005,945 10/1961 Salzer ............................. 361/104 X
3,017,558 1/1962 Kozacka ......................... 361/104 X
3,699,395 10/1972 Boleky ............................... 337/1 X

OTHER PUBLICATIONS

Deliduka et al., "Monolithic Integrated Circuit Fuse Link," IBM Technical Disclosure Bulletin, vol. 19, No. 4, Sep. 1976, p. 1161.

*Primary Examiner*—A. D. Pellinen
*Attorney, Agent, or Firm*—Frishauf, Holtz, Goodman & Woodward

[57] ABSTRACT

An electrical connection system for alternating current rectifiers, particularly for use in alternating-current bridge-type rectifiers for motor vehicle generators, in which a portion of an electrical conductor embedded in a circuit board is cooled to a lesser extent than the remainder of the electrical conductor. The lesser cooled portion may have a smaller cross-sectional area than do the remaining portions of the electrical conductor. In the case of an overload on the connection system, the lesser cooled and/or smaller cross-section portion melts through.

7 Claims, 4 Drawing Figures

28 27 23 22

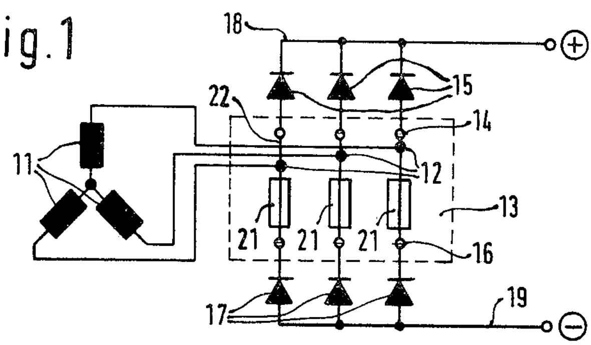
Fig.1
18
15
22
14
11
12
13
21
21
21
16
17
19
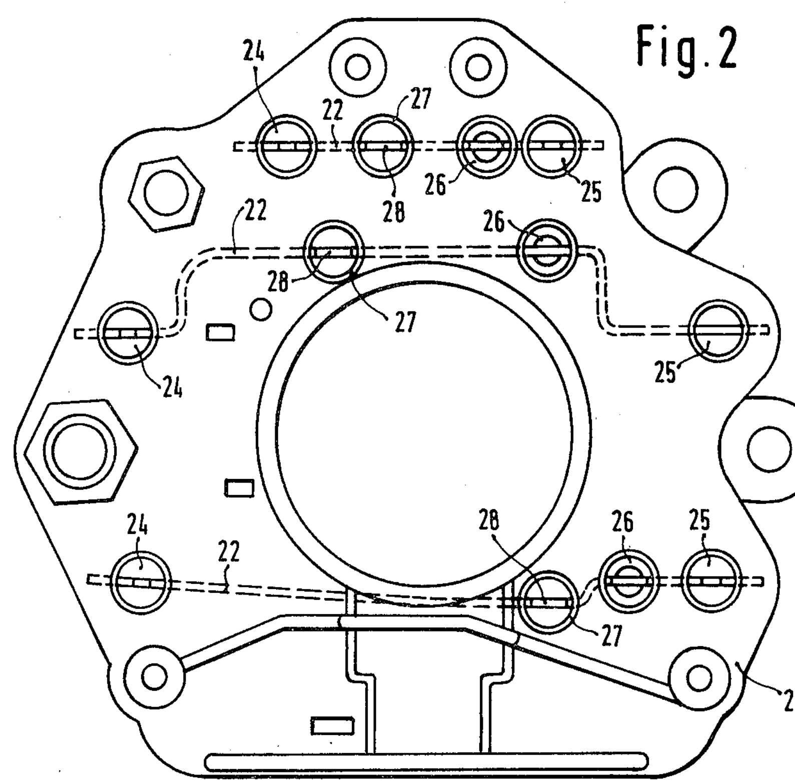
Fig.2
24
22
27
26
28
25
22
26
28
27
24
25
24
22
28
26
25
27
23
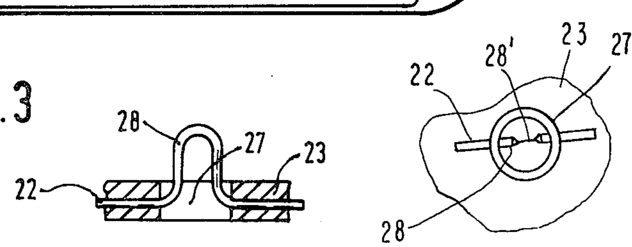
Fig.3
28
27
23
22
22
28'
23
27
28
Fig.3a

ELECTRICAL CONNECTION SYSTEM FOR RECTIFIERS

The present invention relates to an electrical connection system for rectifiers intended in particular for an alternating-current bridge rectifier for generators used in motor vehicles.

BACKGROUND

Depending upon their design and the heat sink used, rectifier diodes can be driven only up to a maximum current level. If this maximum current level is exceeded, the diodes are destroyed. Such destruction occurs not infrequently in battery-charging devices in motor vehicles, if the battery which is to be charged has its terminals connected incorrectly. In this case, the output diodes are switched in the on or forward biased direction, and a relatively high current flows through them, which generally destroys the diodes. Protecting the diodes by means of safety fuses has already been attempted. Safety fuses, however, require additional space, which runs counter to the need for miniaturization of components. Furthermore, holder means for safety fuses are unsuited to the unfavorable conditions in the engine area of an automobile. Electronic protective devices have also been developed; but such devices are too expensive for general application.

THE INVENTION

It is an object of the invention to provide an electrical connection and protection system for rectifiers, especially alternating-current bridge rectifiers for mobile, typically motor vehicle generators, in which no additional components are required and yet the output diodes are fully protected. Preferably, the system should provide an indication of excessively high current which might have caused destruction of a rectifier or whether a diode failed as the result of a manufacturing defect.

Briefly, a connecting strip or line, present and used on a circuit board connecting diodes of the rectifier and the generator is passed across an additional hole in the plate, there being cooled to a lesser extent than where secured to the board. Excessive current will cause burnout at the cross-over location.

The system is essentially immune to functional problems. Since in addition to the protective function, an indication function is obtained as well, a repairman can easily tell whether one of the safety strip portions, which preferably are in the form of loops, has melted through. Finally, it is even possible to make a temporary repair simply by soldering the ends of the safety loop together after a failure has occurred. The connection system according to the invention is compatible with various existing systems; it can be exchanged for a corresponding system already in place.

DRAWING

FIG. 1 is an electrical circuit diagram to aid in understanding the invention;

FIG. 2 shows a circuit board according to the invention;

FIG. 3 shows a detail of the invention, specifically a realization of the melting and indicating wire; and FIG. 3*a* is a top view of a modified arrangement.

DETAILED DESCRIPTION

The sketch of FIG. 1 shows the star-connected 3-phase system 11 of an alternating-current generator, particularly an automotive generator. The ends of the star connected coils 11 are respectively connected to the phase terminals 12 of a rectifier system, which terminals 12 are disposed on a board 13. The board 13 further includes terminals 14 for the anode terminals of positive diodes 15 and terminals 16 for the cathode terminals of negative diodes 17. The cathodes of the positive diodes 15 are coupled in common to a positive output terminal 18, for instance, a positive cooling or heat sink device, and the anode terminals of the negative diodes 17 are commonly coupled to a negative terminal 19, which may be a negative cooling device or heat sink. The system as described so far is known. The present invention resides in the provision of safety elements 21, which are embodied as part of the connections 22 connecting the terminal points 12 and 14 together.

FIG. 2 illustrates an actual structural embodiment of the invention. Conducting lines or strips, forming the connections 22 are embedded in a circuit board 23 made of insulating material. The circuit board 23 has a series of recesses of a kind already known as well as a series of additional recesses in accordance with the invention. For instance, the recesses 24 in which the conducting lines 22 extend are already known. After the circuit board 23 has been finally assembled, the anode terminals of the positive diodes 15 protrude into the recesses 24; at this point, the anode terminals are secured to the associated line 22, for instance by welding. There are also recesses 25 which are known, and which may be termed primary recesses and which serve to connect the cathode terminals of the negative diodes 17 to the associated line 22. Finally, recesses 26 are also known; the associated phase terminal of the coils 11 is attached to the line 22 which is exposed at this point.

In addition, in accordance with the present invention, further recesses or cut-outs 27 are provided. The further recesses 27 serve solely to carry a portion 28 of the line 22, which then serves as a safety or protective element like a fuse. Portion 28 is free from the bed represented by the circuit board 23. That is, portions 28 do not contact the circuit board 23. These portions 28 then undergo less cooling during operation of the rectifier circuit then do the other portions of the lines 22.

FIG. 3 shows the portion 28 of the line or strip 22 in detail. As seen in the drawing, the portion 28 is bent outward from the circuit board 23 in the form of a loop. As a result, it is possible to visually examine the portion 28 from the outside to determine whether it is still intact. It is furthermore possible because of this to solder the ends of a portion 28 together if they should have melted through. The loops 28 are preferably so disposed that they protrude from the side of the circuit board 23 opposite from the diodes 15, 17 and are accessible to repair by soldering, pinching together, or the like.

Instead of being embodied as a loop, the portion 28 of the line 22 may also be placed in a straight line across the further recess 27. The portion 28 may desirably have at least a section of a smaller cross section 28' (FIG. 3*a*) than do the other portions of the lines 22. The cross section of the portion 28 is dimensioned such that it can carry the maximum current normally occurring during operation of the rectifier 15, 17 without being destroyed; however, at some current value exceeding the given maximum current, the portion 28 will melt through.

Various changes and modifications may be made without departing from the scope of the inventive concept.

We claim:

1. In an electrical connection system for an alternating-current rectifier arrangement, in particular for an alternating-current bridge rectifier for a generator which can be used in a motor vehicle having an alternating current rectifier arrangement comprising a plurality of diodes (15, 17), a plurality of phase terminals (12) for receiving a multi-phase alternating current input signal, electrical conductors (22) for connecting the phase terminals with associated terminals of the diodes, and a substantially plate-like insulating body (23) in which said electrical conductors (22) are embedded, and including means for cooling at least a portion (28) of the surface of one of said electrical conductors (22) to a lesser extent than the remaining portion of said at least one electrical conductor (22), including at least one further recess (27) in registration with each of said conductor portions (28) so that each of said conductor portions (28) is in less contact with said insulating body (23) than the remainder of said conductors (22), and said portion or portions (28) of said conductors (22) protrude from said further recess or recesses (27).

2. The electrical connection system of claim 1, wherein said substantially plate-like insulating body (23) has primary recesses (24, 25, 26) in which portions of said electrical conductors (22) extend for connection with terminals of said diodes (15, 17) and/or said phase terminals (12).

3. The electrical connection system of claim 1 or 2, wherein said portion, or portions (28) of said conductors (22) is or are in the form of a loop.

4. The electrical connection system of claim 1 or 2, wherein said portion or portions (28) of said conductors (22) in registration with said further recess or recesses (27) has a smaller cross-sectional area than the remaining portions of said conductors (22).

5. The electrical connection system of claim 6, wherein said portion or portions (28) of said conductors (22) has a section (28') of a smaller cross-sectional area than the remaining portions of said conductors (22).

6. The electrical connection system of claim 3, wherein said loop or loops of said portion or portions (28) of said conductors (22) extend from one side of said plate-like insulating body (23), and said diodes (15, 17) are disposed on the opposite side of said plate-like insulating body (23).

7. The electrical connection system of claim 1, wherein said protruding portion or portions (28) of said conductors are disposed on one side of said plate-like insulating body (23), and said diodes (15,17) are disposed on the other side of said plate-like insulating body (23).

* * * * *